(12) United States Patent  
Kiwanami et al.

(10) Patent No.: US 9,420,696 B2  
(45) Date of Patent: Aug. 16, 2016

(54) METHOD OF MANUFACTURING WIRING SUBSTRATE

(71) Applicant: SHINKO ELECTRIC INDUSTRIES CO., LTD., Nagano-ken (JP)

(72) Inventors: Takayuki Kiwanami, Nagano (JP); Junji Sato, Nagano (JP); Katsuya Fukase, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 170 days.

(21) Appl. No.: 14/446,794

(22) Filed: Jul. 30, 2014

(65) Prior Publication Data

US 2015/0041053 A1 Feb. 12, 2015

(30) Foreign Application Priority Data

Aug. 9, 2013 (JP) ................. 2013-166974

(51) Int. Cl.
*B29C 65/52* (2006.01)
*B32B 37/12* (2006.01)
*B32B 37/26* (2006.01)
*B32B 38/10* (2006.01)
*B32B 43/00* (2006.01)
*H05K 3/00* (2006.01)
*H05K 1/02* (2006.01)
*H05K 1/18* (2006.01)
*H05K 3/46* (2006.01)

(52) U.S. Cl.
CPC ............ *H05K 3/0097* (2013.01); *H05K 1/0271* (2013.01); *H05K 1/185* (2013.01); *H05K 3/4602* (2013.01)

(58) Field of Classification Search
USPC .............. 156/247, 278, 289, 295, 298, 307.3, 156/308.2, 309.6, 701, 719
See application file for complete search history.

(56) References Cited

U.S. PATENT DOCUMENTS

| 5,064,583 | A | * | 11/1991 | Dagostino | ................. B28B 7/38 156/307.3 |
| 6,391,220 | B1 | * | 5/2002 | Zhang | ..................... B32B 37/26 156/247 |
| 2008/0041619 | A1 | * | 2/2008 | Lee | ......................... H01L 24/24 174/260 |
| 2011/0240354 | A1 | | 10/2011 | Furuhata et al. | |

FOREIGN PATENT DOCUMENTS

| JP | 2011216740 A | 10/2001 |
| JP | 2007258541 A | 10/2007 |

* cited by examiner

*Primary Examiner* — Sing P Chan
(74) *Attorney, Agent, or Firm* — Fish & Richardson P.C.

(57) ABSTRACT

A method of manufacturing a wiring substrate includes forming a pair of core substrates, each including a cavity; applying a film that covers the cavity to each core substrates; adhering an electronic component to the film in the cavity of each of the core substrates; arranging a support between the core substrates and a first insulator between the support and the core substrates; stacking the core substrates, the support, and the first insulators so that the first insulators form first insulation layers on the first surfaces of the core substrates, the cavities are filled with the first insulators, and the first insulators fix the corresponding electronic components to the corresponding core substrates; removing the film from the core substrates; and separating the core substrates from the support to separate the core substrates from each other.

8 Claims, 6 Drawing Sheets

METHOD OF MANUFACTURING WIRING SUBSTRATE

CROSS-REFERENCE TO RELATED APPLICATIONS

This application is based upon and claims the benefit of priority from prior Japanese Patent Application No. 2013-166974, filed on Aug. 9, 2013, the entire contents of which are incorporated herein by reference.

FIELD

The present disclosure relates to a method of manufacturing a wiring substrate.

BACKGROUND

Japanese Laid-Open Patent Publication Nos. 2007-258541 and 2011-216740 describe examples of wiring substrates that incorporate electronic components such as chip capacitors. A wiring substrate includes a core substrate and an electronic component, which is arranged in a cavity formed in the core substrate. When manufacturing the wiring substrate, the core substrate is formed including a cavity that is larger than the electronic component. A tape is temporarily applied to the lower surface of the core substrate to close the cavity. The electronic component is adhered to the tape that is exposed in the cavity. The cavity is filled with an insulation resin, which forms an insulation layer on the upper surface of the core substrate where the tape is not applied. When the insulation resin fixes the electronic component to the core substrate, the tape is removed from the core substrate. A further insulation layer is formed on the surface from which the tape was removed. A predetermined number of insulation layers and a predetermined number of wiring layers are formed on each insulation layer.

SUMMARY

In the conventional manufacturing method, a tape is temporarily applied to one surface of the core substrate, and an insulation layer is formed on another surface of the core substrate. When the insulation layer is formed on the core substrate from which the temporarily applied tape is removed, the insulating resin hardens and contracts. This may warp the core substrate. When forcibly correcting the warping of the core substrate, cracks may form in a conductive pattern of the core substrate and cause defoliation of the conductive pattern or the insulation layer.

One aspect of the present invention is a method of manufacturing a wiring substrate. The method includes forming a set of core substrates, each including a first surface, a second surface located on an opposite side of the first surface, and a cavity that opens in the first and second surfaces. The method further includes applying a film that covers the cavity to the second surface of each of the core substrates, adhering an electronic component to the film that is exposed in the cavity of each of the core substrates, arranging a support between the core substrates and arranging a first insulator between the support and each of the core substrates, and stacking the core substrates, the support, and the first insulators so that the first insulators form first insulation layers on the first surfaces of the core substrates, the cavities are filled with the first insulators, and the first insulators fix the corresponding electronic components to the corresponding core substrates. The method also includes removing the film from each of the core substrates, applying a second insulator on the second surface of each of the core substrates to form a second insulation layer on the second surface of each of the core substrates, and separating the core substrates from the support to separate the core substrates from each other.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF EMBODIMENTS

Figure 1:
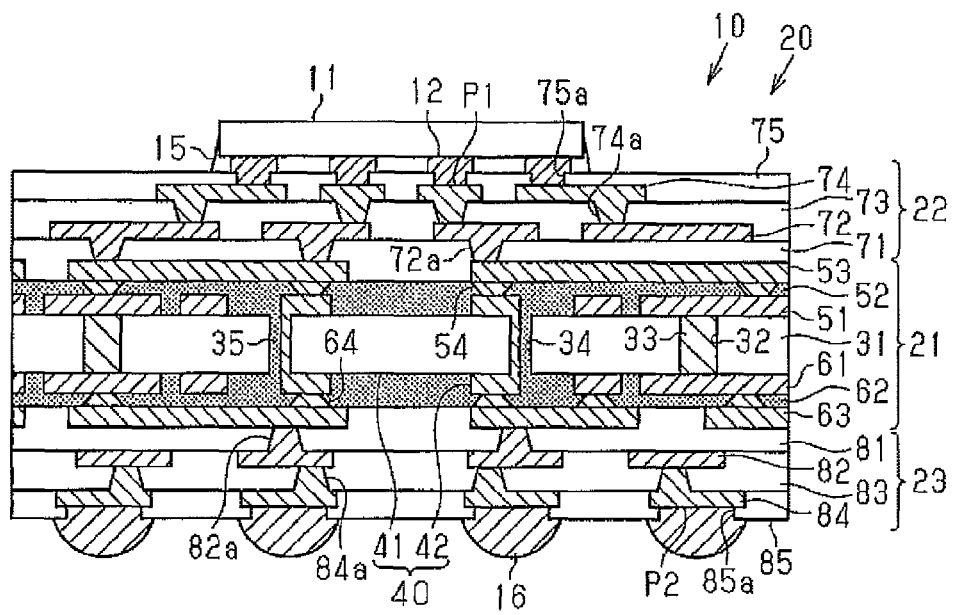
FIG. 1 is a cross-sectional view of a wiring substrate.

In the drawings, elements are illustrated for simplicity and clarity and have not necessarily been drawn to scale. To facilitate understanding, hatching lines may not be illustrated in the cross-sectional views.

A first embodiment will now be described.

As illustrated in FIG. 1, a semiconductor device 10 includes a wiring substrate 20, a semiconductor chip 11 mounted on the wiring substrate 20, and an underfill resin 15 between the wiring substrate 20 and the semiconductor chip 11.

The wiring substrate 20 includes a core 21. The core 21 includes a core substrate 31 that may be a glass-epoxy substrate. The glass epoxy substrate may be obtained by, for example, impregnating a reinforcement material such as a glass cloth (glass woven fabric), with a thermosetting insulative resin such as an epoxy resin. The reinforcement material may be a glass woven fabric, a glass non-woven fabric, an aramid woven fabric, an aramid non-woven fabric, a liquid crystal polymer (LCP) woven fabric, a LCP non-woven fabric. The insulative resin may be an epoxy resin, a polyimide resin or a cyanate resin.

The core substrate 31 includes through holes 32 located at certain positions. Each through hole 32 opens in the upper surface and the lower surface of the core substrate 31 and extends in the thickness direction of the core substrate 31. A through electrode 33 is formed in each through hole 32 and includes an end surface in each of the upper and lower surfaces of the core substrate 31. The through electrode 33 is, for example, circular as viewed from above. The material of the through electrode 33 is, for example, copper and copper alloy.

The core substrate 31 includes a cavity 34 at a certain position. Each cavity 34 is, for example, tetragonal as viewed from above. The cavity 34 opens in the first surface and the second surface of the core substrate 31 and extends in the thickness direction of the core substrate 31.

An electronic component 40 is arranged in the cavity 34. The electronic component 40 is, for example, a chip capacitor. The electronic component 40 includes a main body 41, which may be cuboidal-shaped, and two connection terminals 42, which are located on the two longitudinal ends of the main body 41. The connection terminals 42 cover the longitudinal end surfaces of the main body 41 and the longitudinal ends of the side surfaces of the main body 41. The main body 41 is formed by an electrode of mainly, ceramic, copper, and the like. The connection terminals 42 may be formed from, for example, copper or a copper alloy.

The cavity 34 is filled with an insulation material 35 to fix the electronic component 40 to the core substrate 31. The insulation material 35 is obtained by filling the cavity 34 with a synthetic resin having a certain viscosity and hardening the synthetic resin. The insulation material 35 may be formed from, for example, an epoxy resin, a polyimide resin, or an acrylic resin. Alternatively, the insulation material 35 may be formed from a filler-reinforced resin in which a filler such as silica or alumina is mixed with one or more of the foregoing synthetic resins.

In the present specification, the first surface of each element may refer to the upper surface as viewed in FIG. 1 and the second surface of each element may refer to the lower surface as viewed in FIG. 1. Further, the first surface side may refer to a location on or above the first surface (upper surface as viewed in FIG. 1), and the second surface side may refer to a location on or below the second surface (lower surface as viewed in FIG. 1).

At the first surface side of the core substrate 31, the core 21 includes a wiring layer 51, an insulation layer 52, and a wiring layer 53. The wiring layer 51, the insulation layer 52, and the wiring layer 53 are stacked in this order on the first surface of the core substrate 31. Vias 54, which extend through the insulation layer 52, connect the wiring layer 53 to the wiring layer 51 or the connection terminals 42 of the electronic component 40. Each of the wiring layers 51 and 53 may include wires separated from one another along the first surface of the core substrate 31. The wiring layers 51 and 53 may be formed from, for example, copper or a copper alloy. The insulation layer 52 may be formed from, for example, an epoxy resin, a polyimide resin, or an acrylic resin. Alternatively, the insulation layer 52 may be formed from a filler-reinforced resin in which a filler such as silica or alumina is mixed with one or more of the foregoing synthetic resins.

At the second surface side of the core substrate 31, the core 21 includes a wiring layer 61, an insulation layer 62, and a wiring layer 63. The wiring layer 61, the insulation layer 62, and the wiring layer 63 are stacked in this order on the second surface of the core substrate 31. Vias 64, which extend through the insulation layer 62, connect the wiring layer 63 to the wiring layer 61. Each of the wiring layers 61 and 63 may include wires separated from one another along the second surface of the core substrate 31. The wiring layer 61 includes a wire surrounding the opening of the cavity 34. In some embodiments, the wire surrounding the opening of the cavity 34 may include a closed ring part. The wiring layers 61 and 63 may be formed from, for example, copper or a copper alloy. The insulation layer 62 may be formed from, for example, an epoxy resin, a polyimide resin, or an acrylic resin. Alternatively, the insulation layer 62 may be formed from a filler-reinforced resin in which a filler such as silica or alumina is mixed with one or more of the foregoing synthetic resins.

In the example illustrated in FIG. 1, the core 21 includes the vias 54, which are connected to the upper surfaces of the connection terminals 42 of the electronic component 40, and the vias 64, which are connected to the lower surfaces of the connection terminals 42. However, the vias 54 or 64 may be omitted so that the upper surfaces or the lower surfaces of the connection terminals 42 are connected to vias.

The wiring substrate 20 includes a wiring portion 22, which is located on the first surface side of the core 21, and a wiring portion 23, which is located on the second surface side of the core 21. The wiring portion 22 includes at least one wiring layer and at least one insulation layer that are alternately stacked. The number of wiring layers is set in a suitable manner. Each insulation layer has a thickness that is set to insulate adjacent wiring layers. In the illustrated example, the wiring portion 22 includes an insulation layer 71, a wiring layer 72, an insulation layer 73, and a wiring layer 74. These layers are stacked in this order from the first surface (upper surface) of the core 21. The wiring layers 72 and 84 may be formed from, for example, copper or a copper alloy. The wiring layers 72 and 74 may be formed from, for example, an insulative resin such as an epoxy resin or an acrylic resin.

Vias 72a, which extend through the insulation layer 71, connects the wiring layer 72 to the wiring layer 53. In the same manner, vias 74a, which extend through the insulation layer 73, connects the wiring layer 74 to the wiring layer 72. A resist layer 75 covers the wiring layer 74, which is the outermost layer (uppermost layer as viewed in FIG. 1). The resist layer 75 is formed from, for example, an insulative resin such as an epoxy resin or an acrylic resin. The resist layer 75 includes openings 75a located at certain positions. Portions of the wiring layer 74 exposed from the openings 75a function as external connection pads P1. Bumps 12 of the semiconductor chip 11 may be connected to the pads P1.

In the same manner, the wiring portion 23 includes alternately stacked wiring layers and insulation layers. The number of wiring layers is set in a suitable manner. Each insulation layer has a thickness that is set to insulate adjacent wiring layers. In the illustrated example, the wiring portion 23 includes an insulation layer 81, a wiring layer 82, an insulation layer 83, and a wiring layer 84. These layers are stacked in this order from the second surface (lower surface) of the core 21.

Vias 82a, which extend through the insulation layer 81, connects the wiring layer 82 to the wiring layer 63. In the same manner, vias 84a, which extend through the insulation layer 83, connects the wiring layer 84 to the wiring layer 82. A resist layer 85 covers the wiring layer 84, which is the outermost layer (lowermost layer as viewed in FIG. 1). The resist layer 85 includes openings 85a located at certain positions. Portions of the wiring layer 84 exposed from the openings 85a function as external connection pads P2. The resist layer 85 is formed from, for example, an insulative resin such as an epoxy resin or an acrylic resin. Bumps 16 are formed on the pads P2. The bumps 16 may be used to mount the semiconductor device 10 on a mount board such as a motherboard. The bumps 16 are, for example, solder bumps. Terminals such as lead pins used in lieu of the bumps 16 may be connected to the pads P2.

A method of manufacturing the wiring substrate 20 will now be described. Hereafter, in the drawings, reference characters are added to elements that are described. Reference characters are not added to elements that are not described.

Figure 2A:
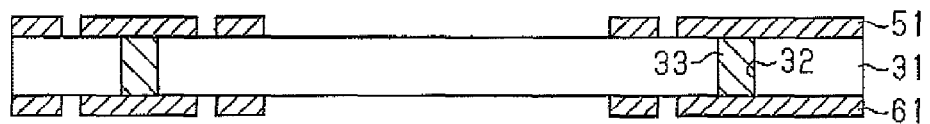
FIGS. 2A and 2B are cross-sectional views illustrating a method of manufacturing the wiring substrate.

The formation of the structure illustrated in FIG. 2A will now be described.

Through holes 32 are formed in a core substrate 31 having a certain thickness. For example, a laser processing machine or a boring machine may be used to form the through holes 32. When using a laser processing machine to form the through holes 32, it is preferred that resin smears or the like be removed from the through holes 32 (desmearing process). The desmearing process is performed using, for example, potassium permanganate.

Then, the through electrodes 33 are formed in the through holes 32. The wiring layer 51 is formed on the upper surface of the core substrate 31. The wiring layer 61 is formed on the lower surface of the core substrate 31. The wiring layer 61 includes a wire surrounding the opening of the cavity 34. The through electrodes 33 and the wiring layers 51 and 61 may be formed by performing electroless copper plating and electrolytic copper plating in this order.

Figure 2B:
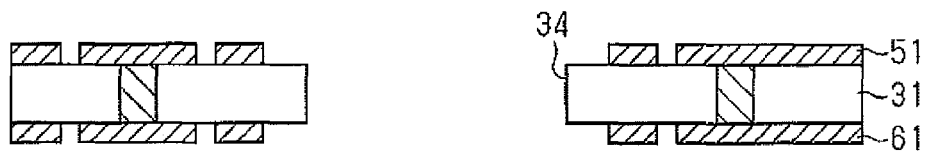

Referring to FIG. 2B, the cavity 34 is formed in the core substrate 31. For example, a punching press that uses dies, a laser processing machining, a boring machining, or a router machine may be used to form the cavity 34. A roughening process is performed on each of the wiring layers 51 and 61. The roughening process may be, for example, an etching process, a CZ process, a blackening process (oxidation process), or a sandblast process. The cavity 34 may be formed after the roughening process.

Figure 3A:
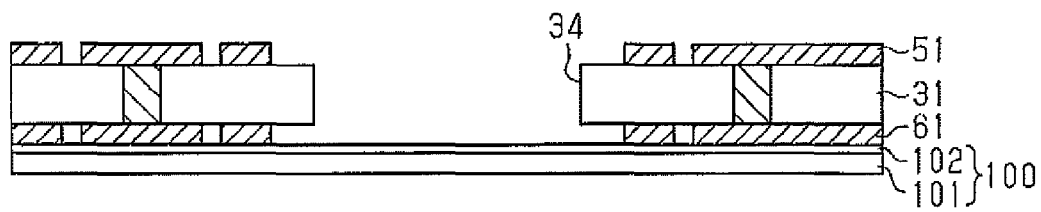
FIGS. 3A to 3C are cross-sectional views illustrating the method of manufacturing the wiring substrate.

Then, referring to FIG. 3A, a temporary fastening film 100 is applied to one surface (lower surface in FIG. 3A) of the core substrate 31. The temporary fastening film 100 includes a carrier 101 and an adhesive material 102 applied to one surface of the carrier 101. The carrier 101 may be formed from, for example, a material that is resistant to chemicals and/or to heat. It is preferred that the carrier 101 be formed from a material having satisfactory workability. Preferred materials of the carrier 101 are, for example, a polyimide resin or a polyester resin. The adhesive material 102 is, for example, epoxy resin or polyimide resin.

Figure 3B:
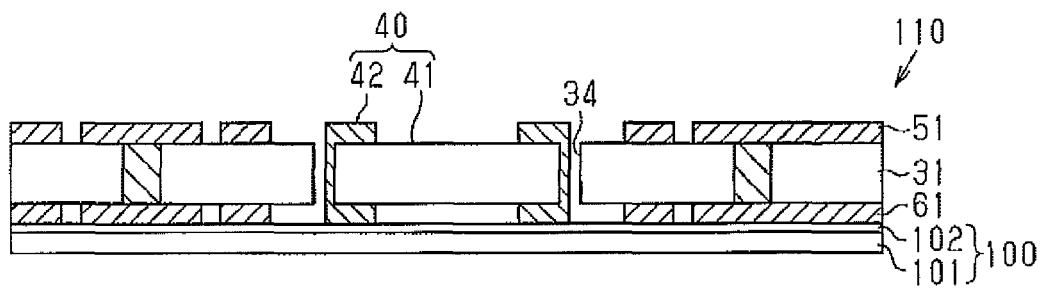

Referring to FIG. 3B, the electronic component 40 is adhered to the film 100 in the cavity 34 of the core substrate 31. The film 100 temporarily fastens the electronic component 40 to the core substrate 31. This forms a structure 110 that includes the film 100, the electronic component 40, and the core substrate 31. Two structures 110 having the same layer structure are prepared. In the description hereafter, the alphabets "a" and "b" are added to the rear of the reference character to distinguish the two structures 110. Further, in FIG. 3C, the alphabet "a" is added to the rear of each reference character used in FIG. 3B to indicate elements of the structure 110a, and the alphabet "b" is added to the rear of each reference character used in FIG. 3B to indicate elements of the structure 110b.

Figure 3C:
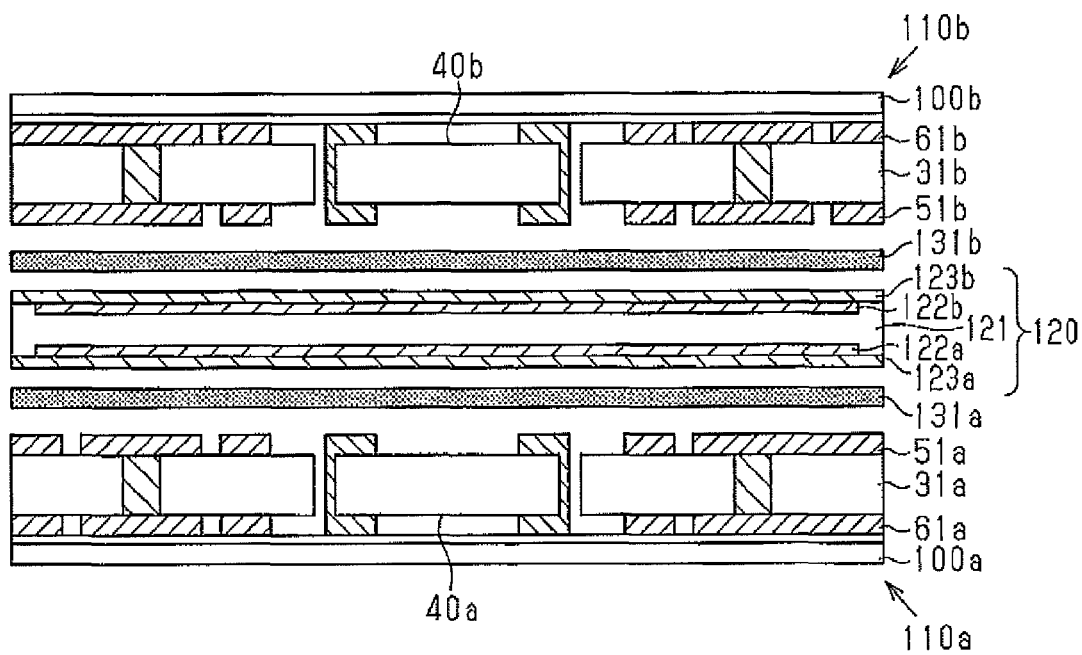

Referring to FIG. 3C, the structures 110a and 110b are arranged opposing each other so that the surfaces of the core substrates 31a and 31b that are free from the films 100a and 100b face the inner sides. A support 120 is arranged between the core substrates 31a and 31b.

The support 120 includes an insulator 121, separation copper foils 122a and 122b, and wiring formation copper foils 123a and 123b. The separation copper foil 122b and the wiring formation copper foil 123b are stacked in this order on the first surface (upper surface in FIG. 3C) of the insulator 121. In the same manner, the separation copper foil 122a and the wiring formation copper foil 123a are stacked in this order on the second surface (lower surface in FIG. 3C) of the insulator 121. The insulator 121 may be, for example, a prepeg in a semi-cured state (B-stage) in which a glass cloth (woven fabric), a glass non-woven fabric, or a base sheet of aramid fibers is impregnated with a thermosetting resin such as an epoxy resin or a polyimide resin.

In the illustrated example, the insulator 121 has a larger size, as viewed from above, than the separation copper foils 122a and 122b. Further, the edges of the insulator 121 extend from the edges of the separation copper foils 122a and 122b.

The size of the separation copper foils 122a and 122b, as viewed from above, may be substantially the same, as the insulator 121. Accordingly, the edges of the wiring formation copper foils 123a and 123b extend from the edges of the separation copper foils 122a and 122b in the planar direction (horizontal direction). The edges of the wiring formation copper foils 123a are adhered to the edges of the insulator 121 at the outer side of the edges of the separation copper foils 122a and 122b.

First insulators 131a and 131b are arranged between the support 120 and the core substrates 31. The first insulators 131a and 131b may be formed from, for example, epoxy resin, a polyimide resin, or an acrylic resin. Alternatively, the first insulators 131a and 131b may be formed from a filler-reinforced resin in which a filler such as silica or alumina is mixed with one or more of the foregoing synthetic resins. In the preferred example, the first insulators 131a and 131b are prepegs in a semi-cured state.

Figure 4A:
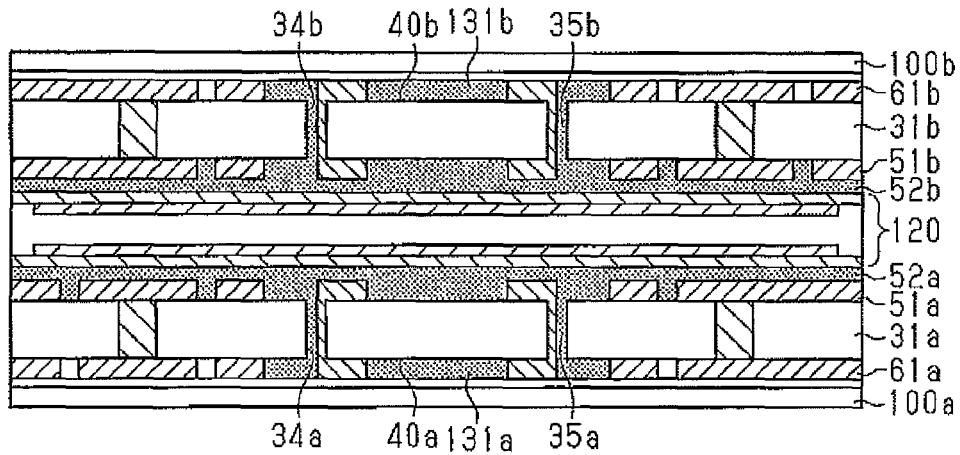
FIGS. 4A to 4C are cross-sectional views illustrating the method of manufacturing the wiring substrate.

Referring to FIG. 4A, the structures 110a and 110b, the support 120, the insulators 131a and 131b are placed in a depressurized (vacuum) atmosphere. Then, a pressing device or the like applies pressure to the structures 110a and 110b toward the support 120. The pressure deforms the first insulators 131a and 131b. This, for example, fills the cavity 34a of the core substrate 31a with the pressed first insulator 131a, which reaches the opposite side of the core substrate 31a through the cavity 34a. The first insulator 131a is included in the wiring layer 61a between the core substrate 31a and the film 100a. Further, the first insulator 131a fills the void surrounded by a wire of the wiring layer 61a extending around the opening of the cavity 34a. In the same manner, the cavity 34b of the core substrate 31b is filled with the first insulator 131b, which reaches the opposite side of the core substrate 31b through the cavity 34b. The first insulator 131b is included in the wiring layer 61b between the core substrate 31b and the film 100b. Further, the first insulator 131b fills the void surrounded by the wire of the wiring layer 61b extending around the opening of the cavity 34b.

Then, for example, a thermal hardening process is performed to thermally harden the insulators 131a and 131b. This forms the insulation layers 52a and 52b and the insulators 35a and 35b. The insulation layers 52a and 52b are each an example of a first insulation layer. It is preferred that the insulators 35a and 35b in the cavities 34a and 34b entirely cover the side surfaces of the electronic components 40a and 40a connecting the upper surfaces and the lower surfaces of the main bodies 41. The insulators 35a and 35b in the cavities 34a and 34b fix the electronic components 40a and 40b to the core substrates 31a and 31b.

Figure 4B:
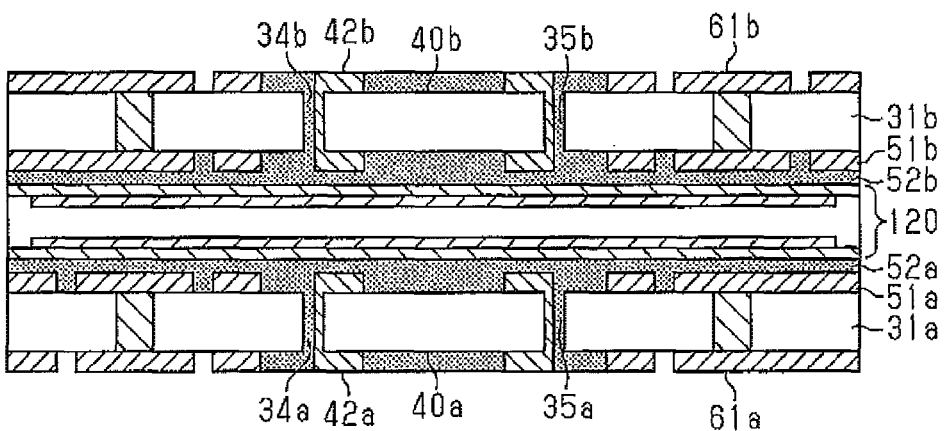

Referring to FIG. 4B, the films 100a and 100b illustrated in FIG. 4A are removed from the structures 110a and 110b. The core substrates 31a and 31b and the insulation layers 52a and 52b are arranged to be symmetrical with respect to the support 120. Accordingly, the stress produced by the contraction of the insulation layer 52a and the stress produced by contraction of the insulation layer 52b are symmetrically produced with respect to the support 120 and offset each other. This prevents or reduces warping of the core substrates 31a and 31b.

The structure illustrated in FIGS. 4A and 4B may be referred to as a symmetric intermediate structure in which the layer structure of the core substrate 31a and the insulation layer 52a and the layer structure of the core substrate 31b and the insulation layer 52b are symmetric to each other with respect to the support 120. In the symmetric intermediate structure, the support 120 and the first insulators 131a and 131b are located between the first surfaces of the core substrates 31a and 31b. In some embodiments, the core substrates 31a and 31b are arranged to be symmetric to each other with respect to the center of the support 120 and the first insulators 131a and 131b are arranged to be symmetric to each other with respect to the center of the support 120. The center of the support 120 may function as a center of symmetry of the symmetric intermediate structure.

The exposed surfaces of the wiring layers 61a and 61b and the connection terminals 42a and 42b of the electronic components 40a and 40b undergo cleaning, which is, for example, a roughening process. The cleaning removes residues from the exposed surfaces of the wiring layers 61a and 61b and the connection terminals 42a and 42b of the electronic components 40a and 40b.

Figure 4C:
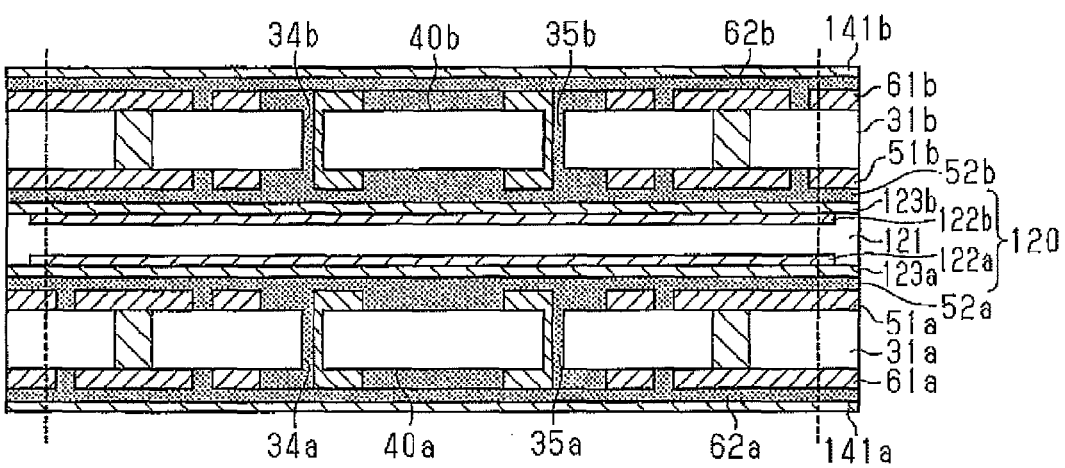

Then, referring to FIG. 4C, the insulation layer 62a, which covers the wiring layer 61a, and a copper foil 141a, which covers the insulation layer 62a, are stacked. In the same manner, the insulation layer 62b, which covers the wiring layer 61b, and a copper foil 141b, which covers the insulation layer 62b, are stacked. The insulation layers 62a and 62b are obtained by, for example, applying pressure and heat under a depressurized atmosphere to second insulators, which are similar to the insulators 131a and 131b respectively stacked on the upper surface and the lower surface of the structure of FIG. 4B, and the copper foils 141a and 141b.

Figure 5A:
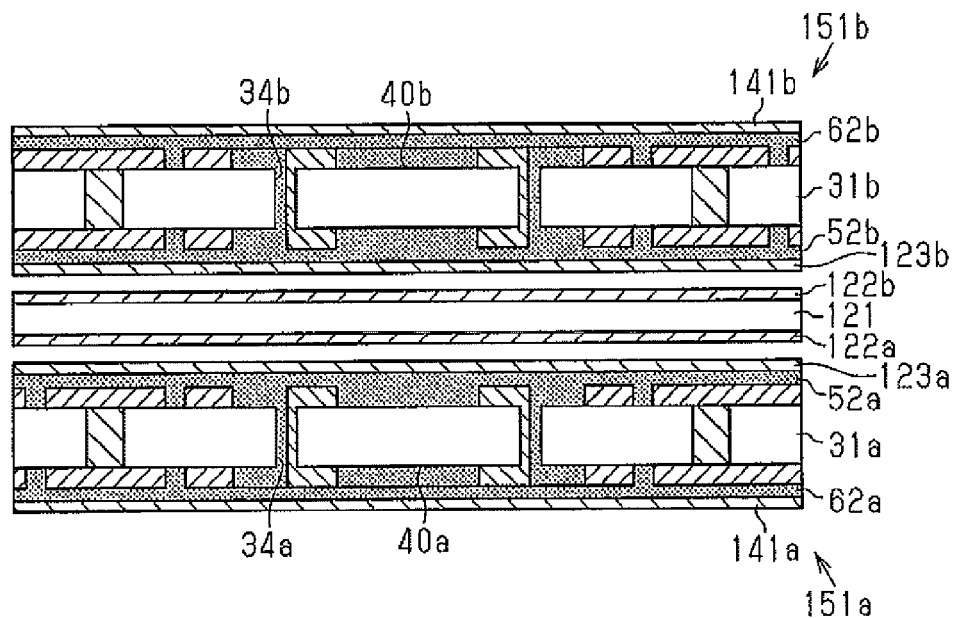
FIGS. 5A and 5B are cross-sectional views illustrating a method of manufacturing the wiring substrate.

The structure of FIG. 4B is cut along the broken lines illustrated in FIG. 4C. The cutting positions correspond to the edges of the separation copper foils 122a and 122b. Further, the inner sides of the edges of the separation copper foils 122a and 122b, that is, the distance between the cut positions is set to be smaller than the size of the separation copper foils 122a and 122b. Referring to FIG. 5A, the wiring formation copper foils 123a and 123b are separated from the insulator 121 to obtain two structures 151a and 151b. The structure 151a includes a core substrate 31a, an electronic component 40a accommodated in the cavity 34a of the core substrate 31a, the insulation layers 52a and 62a covering the first and second surfaces of the core substrate 31a, and the copper foils 123a and 141a covering the insulation layers 52a and 62a. In the same manner, the structure 151b includes a core substrate 31b, an electronic component 40b accommodated in the cavity 34b of the core substrate 31b, the insulation layers 52b and 62b covering the first and second surfaces of the core substrate 31b, and the copper foils 123b and 141b covering the insulation layers 52b and 62b. The structures 151a and 151b may be referred to as core structure bodies.

Referring to FIG. 4C, the separation copper foils 122a and 122b are merely stacked on the wiring formation copper foils 123a and 123b. Accordingly, when cutting the edges of the wiring formation copper foils 123a and 123b that are adhered to the insulator 121 of the support 120, the wiring formation copper foils 123a and 123b are easily separated from the separation copper foils 122a and 122b. Here, the insulation layer 52a, which covers the first surface of the core substrate 31a, and the insulation layer 62a, which covers the second surface of the core substrate 31a, have been hardened. This limits warping of the core substrate 31a during the separation. In the same manner, the insulation layer 52b, which covers the first surface of the core substrate 31b, and the insulation layer 62b, which covers the second surface of the core substrate 31b, have been hardened. This limits warping of the core substrate 31b during the separation.

Figure 5B:
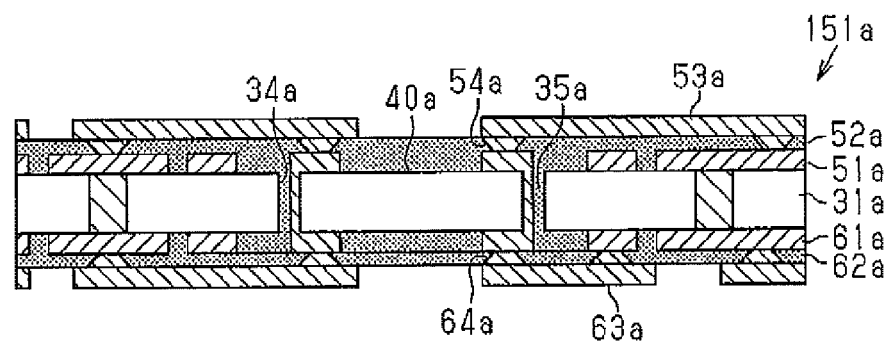

Then, referring to FIG. 5B, vias 54a and 64a are formed in the structure 151a. A surface treatment layer (e.g., plating) is formed and patterned on each of the copper foils 123a and 141a to form wiring layers 53a and 63a, which are illustrated in FIG. 5B.

The example of FIG. 5B illustrates the structure 151a that includes the core substrate 31a. In the same manner, vias and surface treatment layers (e.g., plating) are formed on the structure 151b (refer to FIG. 5A) that includes the core substrate 31b. A buildup process is performed to form the wirings 22 and 23 illustrated in FIG. 1.

The advantages of the above embodiment will now be described.

(1) The film 100a is applied to the second surface of the core substrate 31a. Further, the electronic component 40a, which is arranged in the cavity 34a of the core substrate 31a, is fixed to the film 100a. This forms the structure 110a. In the same manner, the film 100b is applied to the second surface of the core substrate 31b. Further, the electronic component 40b, which is arranged in the cavity 34b of the core substrate 31b, is fixed to the film 100b. This forms the structure 110b. The structures 110a and 110b are arranged so that the surfaces of the core substrates 31a and 31b to which the films 100a and 100b are not applied face toward each other. The support 120 is arranged between the structures 110a and 110b. The insulator 131a is arranged between the structure 110a and the support 120. The insulator 131b is arranged between the structures 110b and the support 120. Pressure is applied to these components to stack the components. The insulators 131a and 131b enter the cavities 34a and 34b of the core substrates 31a and 31b. This fixes the electronic components 40a and 40b. The insulators 131a and 131b are hardened to form the insulation layers 52a and 52b that cover the first surfaces of the core substrates 31a and 31b. Then, the films 100a and 100b are removed from the core substrates 31a and 31b.

The core substrates 31a and 31b and the insulation layers 52a and 52b are arranged to be symmetrical with respect to the support 120. Accordingly, the stress produced by the contraction of the insulation layer 52a and the stress produced by contraction of the insulation layer 52b are symmetrically produced with respect to the support 120 and offset each other. This prevents or reduces warping of the core substrates 31a and 31b.

(2) Warping of each of the core substrates 31a and 31b is limited when forming the insulation layers 62a and 62b that cover the second surfaces of the core substrates 31a and 31b. This allows for the stacking of insulators, which are used to form the insulation layers 62a and 62b, on a flat surface. Thus, stacking is facilitated.

(3) Warping of each of the core substrates 31a and 31b is limited. Thus, there is need to forcibly flatten and correct the shape of the core substrates 31a and 31b. This obviates defects, such as cracks that may occur when correcting the shapes of the core substrates 31a and 31b.

(4) Warping of each of the core substrates 31a and 31b is limited. This facilitates the transportation (handling) of the core substrates 31a and 31b in processes subsequent to the separation of the core substrates 31a and 31b and improves the operability.

(5) The first insulators 131a and 131b, which form the insulation layers 52a and 52b, fill the voids extending around the openings of the cavities 34a and 34b and surrounded by the wires of the wiring layers 61a and 61b through the cavities 34a and 34b of the core substrates 31a and 31b. The wiring layers 61a and 61b are located on the surfaces of the core substrates 31a and 31b opposite to the surfaces where the insulators 131a and 131b are arranged. The voids extend between the films 100a and 100b and the surfaces on which the insulators 131a and 131b are arranged. By filling the voids with the first insulators 131a and 131b, the electronic components 40*a* and 40*b* remain in the cavities 34*a* and 34*b* when removing the films 100*a* and 100*b*.

It should be apparent to those skilled in the art that the present invention may be embodied in many other specific forms without departing from the spirit or scope of the invention. Particularly, it should be understood that the present invention may be embodied in the following forms.

The wiring substrate 20 of FIG. 1 is configured so that the semiconductor chip 11 is mounted on the first side (upper side as viewed in FIG. 1) of the core substrate 31. However, the wiring substrate may be configured so that the semiconductor chip 11 is mounted on the second side (lower side as viewed in FIG. 1) of the core substrate 31.

The foregoing manufacturing process may be modified with the scope of the claims.

For example, the step illustrated in FIG. 3C uses the support 120 obtained by stacking the insulator 121, the separation copper foils 122*a* and 122*b*, and the wiring formation copper foils 123*a* and 123*b*. The insulator 121, the separation copper foils 122*a* and 122*b*, and the wiring formation copper foils 123*a* and 123*b* that are included in the support 120 may be stacked at the same time as when stacking the structures 110*a* and 110*b* and the insulators 131*a* and 131*b*. This obtains the structure of FIG. 4A in a single stacking step and reduces the number of steps.

For example, in the step illustrated in FIG. 3C, the structure 110*a*, the insulator 131*a*, the support 120, the insulator 131*b*, and the structure 110*b* may be sequentially stacked in this order.

For example, after applying the insulators 131*a* and 131*b* to the structures 110*a* and 110*b* or the support 120, the joined bodies may be stacked.

For example, in the step illustrated in FIG. 3C, the wiring formation copper foils 123*a* and 123*b* may be adhered together with an adhesive agent. In this case, it is preferred that the edges of the two wiring formation copper foils 123*a* and 123*b* be adhered to each other with the adhesive agent only at their edges.

For example, a through electrode may be formed after incorporating the electronic component. More specifically, the through electrode is formed after separating the support 120 from a core substrate on which the insulation layers 52*a* and 62*a* (refer to, for example, FIG. 5A) are formed in the same manner as the foregoing process. The steps performed after the separation will now be described. The description hereafter will use the same reference characters as those used for the core structure illustrated in FIG. 5A or similar reference characters less the alphabet "a".

Figure 6A:
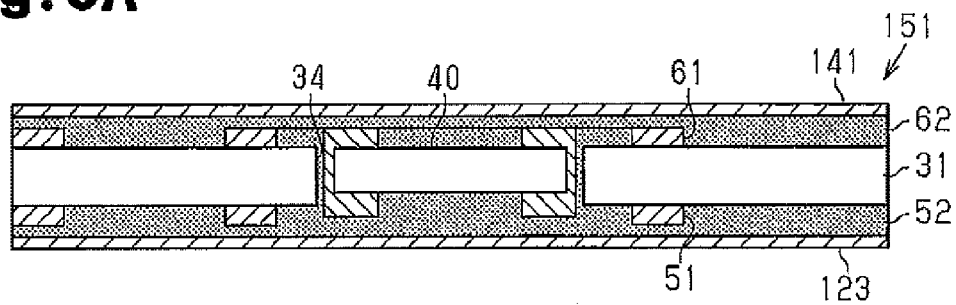
FIGS. 6A to 6E are cross-sectional views illustrating the method of manufacturing the wiring substrate.
Figure 6B:
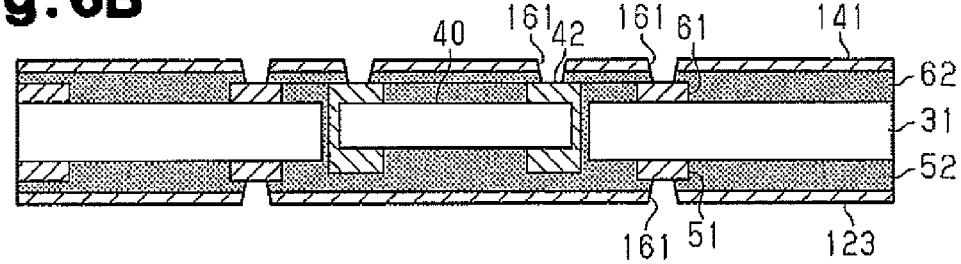
Figure 6C:
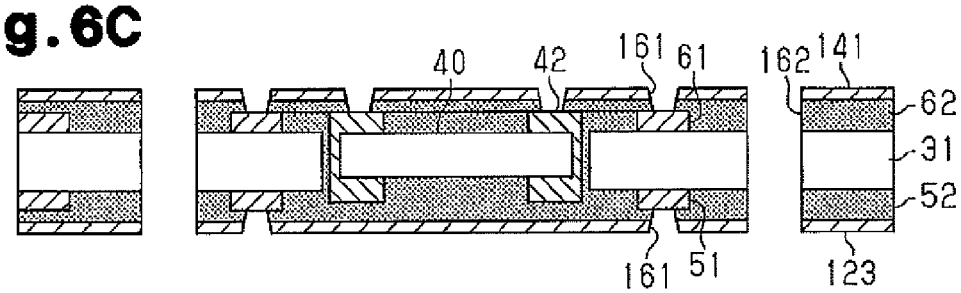
Figure 6D:
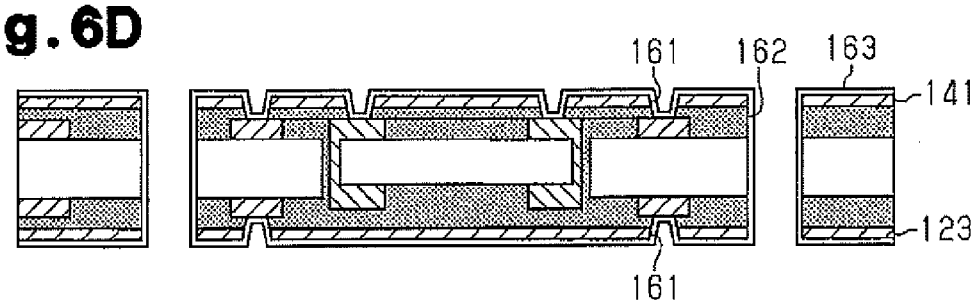
Figure 6E:
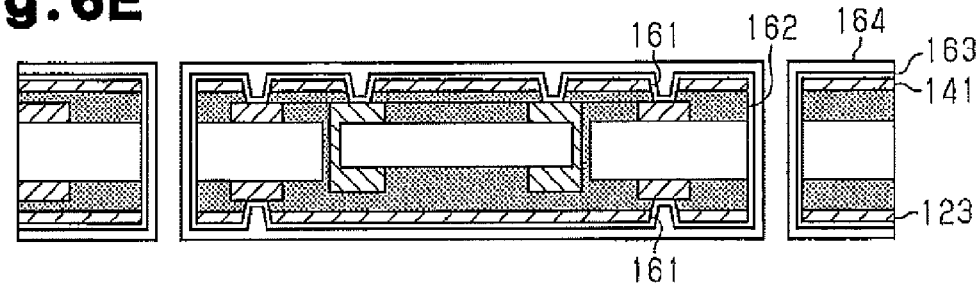

Referring to FIG. 6A, the separated structure 151 undergoes X-ray drilling, reference hole and end surface processing, engraving, and the like. Then, as illustrated in FIG. 6B, the copper foils 123 and 141 undergo a roughening process (CE process, blackening process). Laser processing or the like is performed to form the via holes 161. The connection terminal 42 of the electronic component 40 and the wiring layers 51 and 61 are exposed from the via holes 161. For example, referring to FIG. 6C, through holes 162 are formed in a machine drilling process and undergo a desmearing process. Then, referring to FIG. 6D, electroless plating or vapor deposition is performed to form a metal film 163 on the surfaces. The metal film 163 is formed from, for example, copper. Referring to FIG. 6E, electrolytic plating that uses the metal film 163 as an electrode is performed to form a metal plating layer 164 of copper. In FIG. 6B, via holes may be formed from the lower copper foil 123 to expose the connection terminals 42 of the electronic component 40 and form vias connected to the connection terminals 42. Vias connected to the connection terminals 42 may be formed in the two sides of the core substrate 31.

Figure 7A:
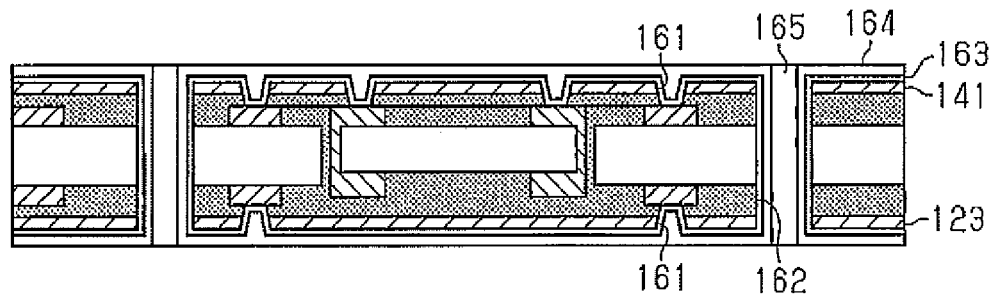
FIGS. 7A to 7D are cross-sectional views illustrating the method of manufacturing the wiring substrate.

Then, referring to FIG. 7A, each through hole 162, of which the wall is covered by the metal film 163 and the plating layer 164, is filled with an insulator 165. The material of the insulator 165 is, for example, epoxy resin, acrylic resin, and a mixture thereof. The through hole 162 is filled with the insulator 165 by performing a printing process using a mask screen and a squeegee under a depressurized atmosphere (e.g., vacuum). After hardening the insulator 165, the surface of the insulator 165 is polished to be generally flush with the metal plating layer 164. The insulator 165 is polished through buffing and blasting. The through holes 162 may be filled with a conductor (e.g., solder).

Figure 7B:
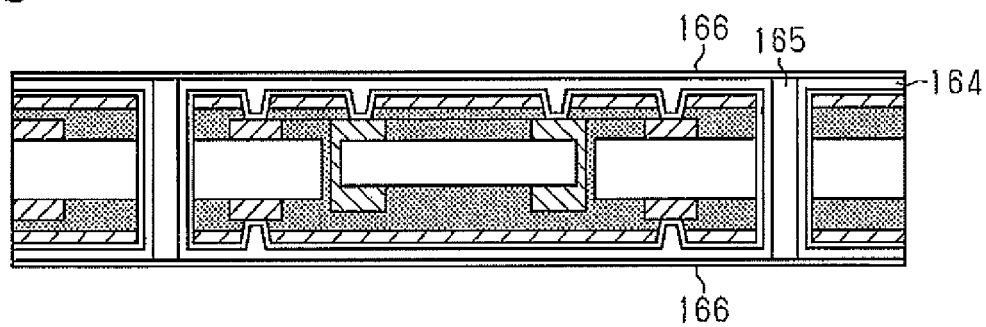
Figure 7C:
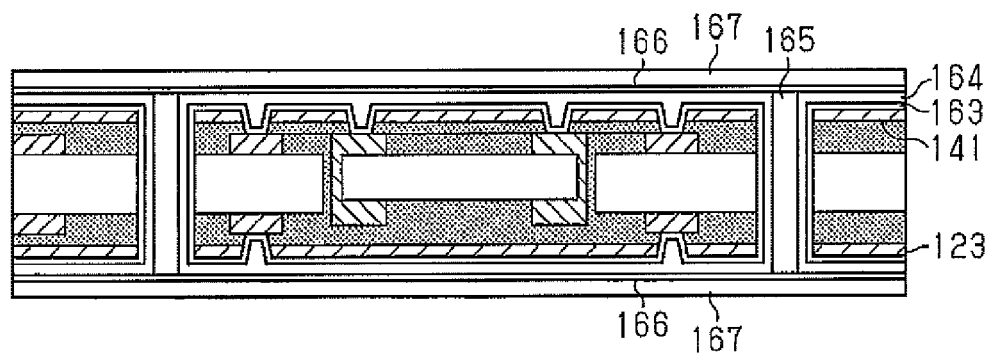
Figure 7D:
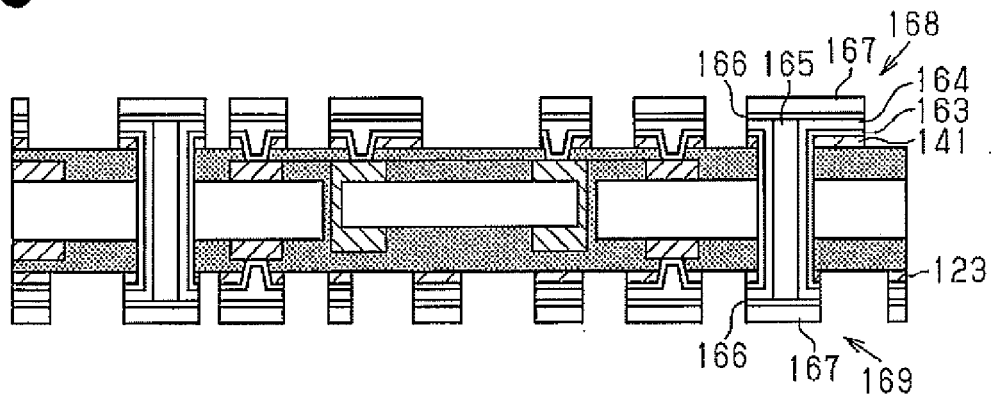

Subsequently, referring to FIG. 7B, a desmearing process is performed to remove residues from the surface. Then, electroless copper plating is performed to form a conductive layer on the upper surface and the lower surface. Further, referring to FIG. 7C, electrolytic copper plating is performed to form a cover plating 167 on the surface of the conductive layer 166. Referring to FIG. 7D, for example, the copper foils 123 and 141, the metal film 163, the metal plating layer 164, the conductive layer 166, and the cover plating 167 undergo, for example, etching and are patterned to a certain shape to obtain the wiring layers 168 and 169. Then, a buildup process is performed to form a wiring portion.

The core 21 may be modified. For example, each through electrode 33 illustrated in FIG. 1 may be a resin-filled electrode that includes a tubular conductor, an insulator, and lands. The tubular conductor is formed on the wall surface of the corresponding through hole and filled with the insulator. The lands close the ends of the conductor.

In the step illustrated in FIG. 4A, for example, the electronic component 40*a* is fixed by filling the cavity 34*a* of the core substrate 31*a* with the insulator 131*a*. However, a portion of the electronic component 40*a* may be exposed from the insulator 131*a* as long as the electronic component 40*a* remains fixed when removing the film 100*a*. Referring to FIG. 4C, in the step that forms the insulation layer, the cavity 34*a* may be filled with an insulator.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although embodiments of the present invention have been described in detail, it should be understood that various changes, substitutions, and alterations could be made hereto without departing from the spirit and scope of the invention.

The invention claimed is:

1. A method of manufacturing a wiring substrate, the method comprising, sequentially:

forming a pair of core substrates, each including a first surface, a second surface located on an opposite side of the first surface, and a cavity that opens in the first and second surfaces;

applying a film that covers the cavity to the second surface of each of the core substrates;

adhering an electronic component to the film that is exposed in the cavity of each of the core substrates;

arranging a support between the core substrates and arranging a first insulator between the support and each of the core substrates, wherein the first surfaces of the core substrates face the respective first insulator, and the first surfaces of the core substrates face toward each other and face toward the support;

stacking the core substrates, the support, and the first insulators so that the first insulators form first insulation layers on the first surfaces of the core substrates, the cavities are filled with the first insulators, and the first insulators fix the corresponding electronic components to the corresponding core substrates, with the film covering the second surface of each of the core substrates;

applying heat to have the core substrates, the support, and the first insulators integrated;

removing the film from each of the core substrates;

applying a second insulator on the second surface of each of the core substrates to form a second insulation layer on the second surface of each of the core substrates; and separating the core substrates from the support to separate the core substrates from each other.

2. The method according to claim 1, wherein the forming the pair of core substrates includes forming a wiring layer including a wire surrounding the cavity on the second surface of each of the core substrates;

voids extending between the support and the first surfaces of the core substrates, the cavities of the core substrates, and voids surrounded by the wires of the wiring layers between the films and the second surfaces of the core substrates are filled with the first insulators that fix the electronic components to the core substrates; and the second insulation layers cover the wiring layers.

3. The method according to claim 1, wherein the support includes a support plate, separation copper foils applied to opposite surfaces of the support plate, and wiring formation copper foils arranged on surfaces of the separation copper foils; and the method further comprises separating the wiring formation copper foils from the separation copper foils to separate a pair of structures from the support plate, wherein each of the structures includes one of the core substrates and one of the wiring formation copper foils.

4. The method according to claim 3, further comprising forming a wiring layer on each of the structures from the one of the wiring formation copper foils.

5. The method according to claim 1, wherein the support includes two wiring formation copper foils, each including an edge, and the wiring formation copper foils are adhered to each other at the edges;

the method further comprises cutting the edges of the two wiring formation copper foils to separate a pair of structures from each other, wherein each of the structures includes one of the core substrates and one of the wiring formation copper foils.

6. The method according to claim 1, wherein the stacking includes forming a symmetric intermediate structure in which the core substrates, the support, and the first insulators are stacked by arranging the support and the first insulators between the first surfaces of the core substrates; and the core substrates and the first insulators are arranged to be symmetrical with respect to the support in the symmetric intermediate structure.

7. The method according to claim 6, wherein the symmetric intermediate structure includes a center of symmetry in the support.

8. The method according to claim 6, wherein the stacking includes forming the first insulation layers on the first surfaces of the core substrates by deforming and hardening the first insulators in the symmetric intermediate structure.

* * * * *